United States Patent
Chung et al.

(10) Patent No.: US 11,243,600 B2
(45) Date of Patent: Feb. 8, 2022

(54) HMC CONTROL DEVICE AND METHOD OF CPU SIDE AND HMC SIDE FOR LOW POWER MODE, AND POWER MANAGEMENT METHOD OF HMC CONTROL DEVICE

(71) Applicant: INDUSTRY-UNIVERSITY COOPERATION FOUNDATION HANYANG UNIVERSITY, Seoul (KR)

(72) Inventors: Ki-Seok Chung, Seoul (KR); Dong Ik Jeon, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/628,333

(22) PCT Filed: Jul. 3, 2018

(86) PCT No.: PCT/KR2018/007507
§ 371 (c)(1),
(2) Date: Jan. 3, 2020

(87) PCT Pub. No.: WO2019/009585
PCT Pub. Date: Jan. 10, 2019

(65) Prior Publication Data
US 2020/0174548 A1      Jun. 4, 2020

(30) Foreign Application Priority Data

Jul. 3, 2017   (KR) .................. 10-2017-0084106
Jul. 5, 2017   (KR) .................. 10-2017-0085557

(51) Int. Cl.
G06F 1/3287      (2019.01)
G06F 13/40       (2006.01)
H04L 12/12       (2006.01)

(52) U.S. Cl.
CPC ........ *G06F 1/3287* (2013.01); *G06F 13/4027* (2013.01); *H04L 12/12* (2013.01)

(58) Field of Classification Search
CPC .... G06F 13/364; G06F 3/0613; G06F 3/0635; G06F 3/1218; G06F 2009/45579; H04L 63/1408

(Continued)

(56) References Cited

U.S. PATENT DOCUMENTS 6,940,831 B1 *   9/2005  Omi ................. H04W 72/1236
                                                 370/310.1
7,668,090 B1 *   2/2010  Charny .............. H04L 47/822
                                                 370/230

(Continued)

FOREIGN PATENT DOCUMENTS

JP    2016-534665 A    11/2016
KR    10-0943728 B1    2/2010
KR    10-2017-0002604 A    1/2017

OTHER PUBLICATIONS

Lee, Jae-Myeong et al., "Performance Analysis of Hybrid Memory Cube Based on High Speed Serial Link Configuration", Proceedings of the 2016 Korean Society for Internet Information Fall Conference, Nov. 2016, pp. 219-220, vol. 17, No. 2.

(Continued)

*Primary Examiner* — Faisal M Zaman
(74) *Attorney, Agent, or Firm* — Sughrue Mion, PLLC (57) ABSTRACT

Disclosed are an HMC controller and a controlling method on a CPU side and an HMC side for a low power mode, and a recording medium related thereto. The CPU side HMC controller includes a plurality of link units, each of which (Continued)

includes a link master for storing request packets of a CPU in a request buffer and transmitting the request packets to an HMC side HMC controller in the order that they are stored; and a link slave for storing the request packets received from the HMC side HMC controller in a response buffer and transmitting the request packets to the CPU in the order that they are stored.

5 Claims, 10 Drawing Sheets

(58) Field of Classification Search
USPC .................................. 370/311, 318; 710/113
See application file for complete search history.

(56) References Cited

U.S. PATENT DOCUMENTS

| | | | |
|---|---|---|---|
| 7,697,431 B1 * | 4/2010 | Bangolae | H04L 12/5601 370/235 |
| 2003/0063624 A1 * | 4/2003 | Nagarajan | H04L 47/15 370/468 |
| 2003/0226017 A1 * | 12/2003 | Palekar | H04L 63/08 713/168 |
| 2004/0224668 A1 * | 11/2004 | Shell | H04L 41/0886 455/412.1 |
| 2006/0248208 A1 * | 11/2006 | Walbeck | H04L 29/06 709/230 |
| 2008/0195745 A1 * | 8/2008 | Bowra | H04L 65/4092 709/231 |
| 2009/0103444 A1 * | 4/2009 | Khatri | G06F 1/3215 370/252 |
| 2011/0219197 A1 | 9/2011 | Perego et al. | |
| 2011/0249684 A1 * | 10/2011 | Nagai | H04L 49/357 370/419 |
| 2012/0008503 A1 * | 1/2012 | Qiu | H04L 47/125 370/238 |
| 2012/0324078 A1 * | 12/2012 | Sugimoto | G06F 13/4282 709/223 |
| 2013/0219038 A1 * | 8/2013 | Lee | H04L 67/327 709/223 |
| 2016/0337223 A1 * | 11/2016 | Mackay | H04L 43/16 |
| 2017/0351570 A1 * | 12/2017 | Laity | G06F 11/1068 |

OTHER PUBLICATIONS

Hybrid Memory Cube Consortium, "Hybrid Memory Cube Specification 1.1", 2014.
International Search Report of PCT/KR2018/007507 dated Oct. 2, 2018 [PCT/ISA/210].

* cited by examiner

| Active Link | Bandwidth |
|---|---|
| 4 | $\alpha DB \geq 180$ or $\alpha UB \geq 180$ |
| 3 | $120 \leq \alpha DB < 180$ or $120 \leq \alpha UB < 180$ |
| 2 | $60 \leq \alpha DB < 120$ or $60 \leq \alpha UB < 120$ |
| 1 | $\alpha DB < 60$ or $\alpha UB < 60$ |

HMC CONTROL DEVICE AND METHOD OF CPU SIDE AND HMC SIDE FOR LOW POWER MODE, AND POWER MANAGEMENT METHOD OF HMC CONTROL DEVICE

CROSS REFERENCE TO RELATED APPLICATIONS

This application is a National Stage of International Application No. PCT/KR2018/007507, filed Jul. 3, 2018, claiming priorities to Korean Patent Application No. 10-2017-0084106, filed Jul. 3, 2017 and Korean Patent Application No. 10-2017-0085557, filed Jul. 5, 2017.

TECHNICAL FIELD

The present disclosure relates to an HMC controller on a CPU side and an HMC side for a low power mode and a method the same, and a method for managing power of the HMC controller.

DESCRIPTION OF THE RELATED ART

A hybrid memory cube (HMC) is connected to a CPU using a high speed serial link to exchange data at high speed. The high speed serial link is fast, but there is a problem in that the high speed serial link consumes a lot of power because it always needs to keep the connection of the link for synchronization even when there is no data to transmit.

To address this power problem, an HMC specification supports a low power mode of the high-speed serial link. If there is a request for a sleep mode from the CPU in an active mode of each link, a conventional HMC controller switches the link to the sleep mode when request packets do not occur for a certain period of time. However, even if the request packets does not occur for the certain period of time, there are cases where a packet to be processed remains in a buffer of the link. Therefore, there is a problem that packet loss occurs when switching to the sleep mode.

In addition, in the sleep mode, a serial converter and a parallel converter are deactivated, and once all links switch to the sleep mode, they are automatically switched to a down mode to further reduce power consumption.

Switching between the modes of the link has a significant impact on performance because of the long mode switching time. For example, if a switching time from the sleep mode to an active mode takes about 1 ms, and if links in the active mode are not transmitting packets immediately due to insufficient link transmission rate, it may be considered that it takes 1 ms to switch one link from the sleep mode to the active mode. Therefore, setting the link mode appropriately depending on the required link performance is very important for the performance of the HMC system.

SUMMARY

In order to solve the problems of the related art as described above, the present disclosure provides an HMC controller on a CPU side and an HMC side for a low power mode in which no packet loss occurs, and a method thereof.

In addition, the present disclosure proposes an HMC controller and a method for managing power of the HMC controller capable of minimizing performance degradation while achieving power efficiency by appropriately setting modes of a plurality of links.

According to an aspect of the present disclosure, a CPU side HMC controller for a low power mode is provided, where the CPU side HMC controller includes a plurality of link units, the plurality of link units including a link master for storing request packets from a CPU in a request buffer and transmitting the request packets to an HMC side HMC controller in the order that they are stored; and a link slave for storing the request packets received from the HMC side HMC controller in a response buffer and transmitting the request packets to the CPU in the order that they are stored, in which the link master is switched to a wait mode in which the request packets of the CPU are no longer received when a request for the low power mode of the CPU occurs, and in which after checking a buffer in the wait mode, the link master generates a check packet and transmits the check packet to the HMC side HMC controller only when the buffer is empty, and in which the link master is switched to the sleep mode when the link slave receives the check packet from the HMC side HMC controller.

The link master generates and transmits the check packet only when all of the request buffer, a re-request buffer for storing a request packet that failed to transmit, and a response buffer of the HMC side HMC controller are empty in the wait mode.

The HMC controller transmits the check packet to the link slave only when the buffer is empty.

The CPU side HMC controller further includes a synchronization unit for synchronizing the link master and the link slave, in which when all link masters are switched to the sleep mode, all link masters are switched to the down mode and the synchronization unit is deactivated.

According to another aspect of the present disclosure, an HMC side HMC controller for a low power mode is provided, where the HMC side HMC controller includes a plurality of link units, the plurality of link units including a link slave for storing request packets received from a CPU side HMC controller in a response buffer and transmitting the request packets to an HMC in the order that they are stored; and a link master for storing the request packets of the HMC in a request buffer and transmitting the request packets to the CPU side HMC controller in the order that they are stored, in which when the link slave receives a check packet for switching to a sleep mode from the CPU side HMC controller, the link master is switched to a wait mode in which the request packets of the HMC are no longer received, and in which after checking a buffer in the wait mode, the link master transmits the check packet to the CPU side HMC controller and is switched to the sleep mode only when the buffer is empty.

According to other aspect of the present disclosure, a method for controlling a CPU side HMC is provided, where the method includes (a) switching a link master to a wait mode which no longer receives request packets of a CPU; (b) checking whether a buffer is empty in the wait mode, by the link master; (c) generating a check packet and transmitting the check packet to an HMC side HMC controller when all the buffers checked in step (b) are empty, by the link master; (d) receiving the check packet from the HMC side HMC controller, by the link master; and (e) switching the link master to a sleep mode.

According to other aspect of the present disclosure, an HMC controller is provided, where the HMC controller includes a link monitor for outputting a cumulative length of request packets and a cumulative length of response packets, processed for a certain time, respectively; and a link selection and power manager for calculating a bandwidth of the request packets and a bandwidth of the response packets using the cumulative length of the request packets and the cumulative length of the response packets output from the link monitor, and determining an appropriate number of active links using the bandwidth of the request packets and the bandwidth of the response packets, in which the link selection and power manager change a predetermined number of link states by comparing the determined appropriate number of active links with a current number of active links.

A length (LNG) field is set in the request packets and the response packets, and length information of the request packets or the response packets is recorded in the length field.

The link monitor outputs the cumulative length of the request packets and the cumulative length of the response packets by using the length information of the length field.

The link selection and power manager determines an appropriate number of active links using a lookup table that matches the appropriate number of active links with a value obtained by multiplying the bandwidth of the request packets and the bandwidth of the response packets by a certain scaling constant.

According to other aspect of the present disclosure, a method for managing power of an HMC controller is provided, where the method includes (a) outputting a cumulative length of request packets and a cumulative length of response packets, processed for a certain time, respectively; (b) calculating a bandwidth of the request packets and a bandwidth of the response packets using the cumulative length of the request packets and the cumulative length of the response packets output in step (a), and determining an appropriate number of active links using the bandwidth of the request packets and the bandwidth of the response packets; and (c) changing a predetermined number of link states by comparing the appropriate number of active links determined in step (b) with a current number of active links.

The present disclosure may stably switch to a low power mode without packet loss.

In addition, the present disclosure may minimize performance degradation while achieving power efficiency by appropriately setting modes of plurality of links.

DETAILED DESCRIPTION OF THE EMBODIMENTS

The present disclosure may have various modifications and may have various embodiments. Accordingly, specific embodiments are illustrated in the drawings and described in detail in the detailed description. However, it should be understood that it is not intended to limit the invention to the specific embodiments, but it includes all changes, equivalents, and substitutes included in the spirit and scope of the present disclosure. In describing each of the drawings, similar reference numerals are used for similar components.

Terms such as first and second may be used to describe various components, but the components should not be limited by the terms. The terms are used only for the purpose of distinguishing one component from another. For example, without departing from the scope of the present disclosure, the first component may be referred to as the second component, and similarly, the second component may also be referred to as the first component. Hereinafter, embodiments of the present disclosure will be described in detail with reference to the accompanying drawings.

Figure 1:
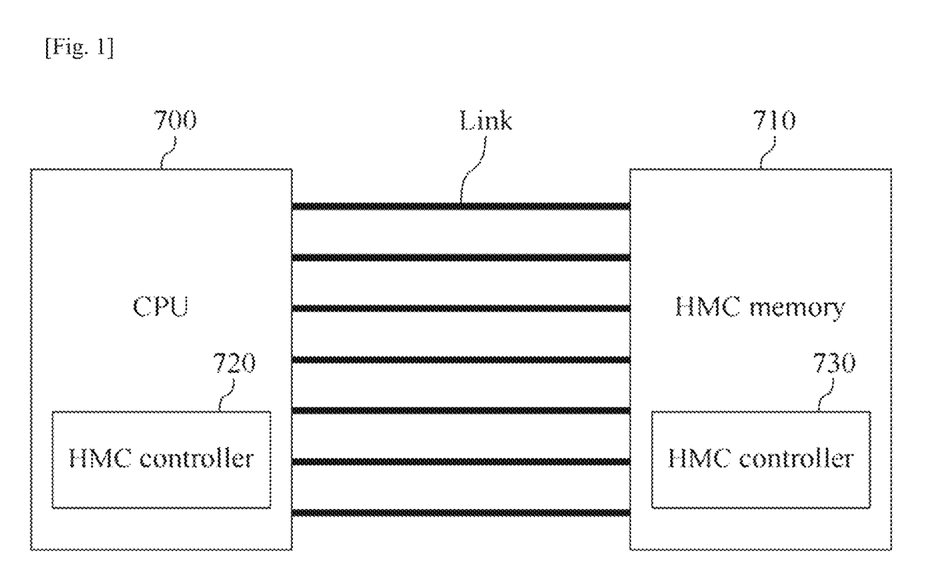
FIG. 1 is a diagram showing of an HMC memory system to which the present disclosure is applied.

FIG. 1 is a diagram showing of an HMC memory system to which the present disclosure is applied.

Referring to FIG. 1, an HMC memory system includes a CPU 700 and an HMC memory 710. The CPU 700 may request a read or write of certain data from the HMC memory 700 using a packet. The HMC memory 700 may perform a read or write operation of data by responding to the request of the CPU.

As shown in FIG. 1, the HMC memory 700 has a 3D stacked structure.

The CPU 700 and the HMC memory 710 are connected via a plurality of links, in which request packets or response packets is transmitted using the plurality of links. Although not shown in FIG. 1, each link is connected to an opposite link by a plurality of lanes. When data is transmitted through one link, the data is converted into a bit string through a serial converter and transferred bit by bit through several lanes. This link is an in-band communication that transmits data and control information together. All data is converted into packets and transmitted.

Packets transmitted and received between the CPU 700 and the HMC memory 710 include various link information for identifying the current situation of a link master which is a start point of data transmission and a link slave which is an end point of data transmission.

As described above, in order to improve power consumption efficiency, a certain link may be set to a sleep mode or a down mode. In the sleep mode, a serial converter and a parallel converter are deactivated. In the down mode, a PLL circuit as well as the serial and parallel converters is deactivated.

In the HMC memory system, each of the CPU 100 and the HMC memory 110 is provided with HMC controllers 120 and 130. The HMC controllers 120 and 130 serve to control a link operation of each of the CPU 100 and the HMC memory 110.

The HMC controllers 120 and 130 according to an embodiment of the present disclosure serve to calculate a bandwidth of the link, determine the optimal number of active links based on the calculated bandwidth, and adjust the overall number of active links based on the determined optimal number of active links. Detailed structure and operation of the HMC controller 120 and 130 will be described in detail with reference to the separate drawings.

Figure 2:
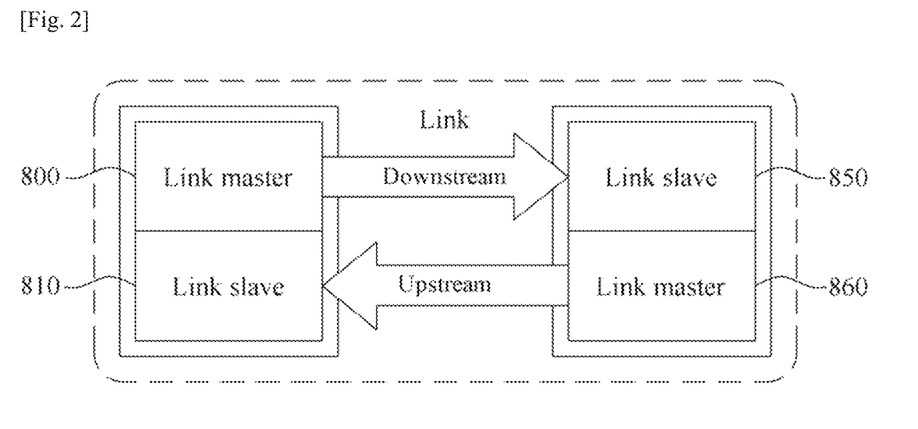
FIG. 2 is a diagram showing of a link in an HMC memory system to which the present disclosure is applied.

FIG. 2 is a diagram showing of a link in an HMC memory system to which the present disclosure is applied.

Referring to FIG. 2, the link of the HMC memory system includes a link master 800 and a link slave 810 on the CPU side, and a link master 850 and a link slave 860 on the HMC memory side.

In FIG. 2, the link masters 800 and 850 only perform a function of transmitting a packet to the opposite side, and the link slaves 810 and 860 only perform a function of receiving the packet from the opposite side.

For example, when a CPU side request packets is to be transmitted, the request packets is transmitted from the CPU side link master 800 to the HMC memory side link slave 860. In addition, when response packets of the HMC memory side are to be transmitted to the CPU, the response packets is transmitted from the HMC side link master 850 to the CPU side link slave 810.

As described above, each link is connected through a plurality of lanes, and although not shown, it uses a serial transformer and a parallel transformer to perform parallelism or serialization of data.

Figure 3:
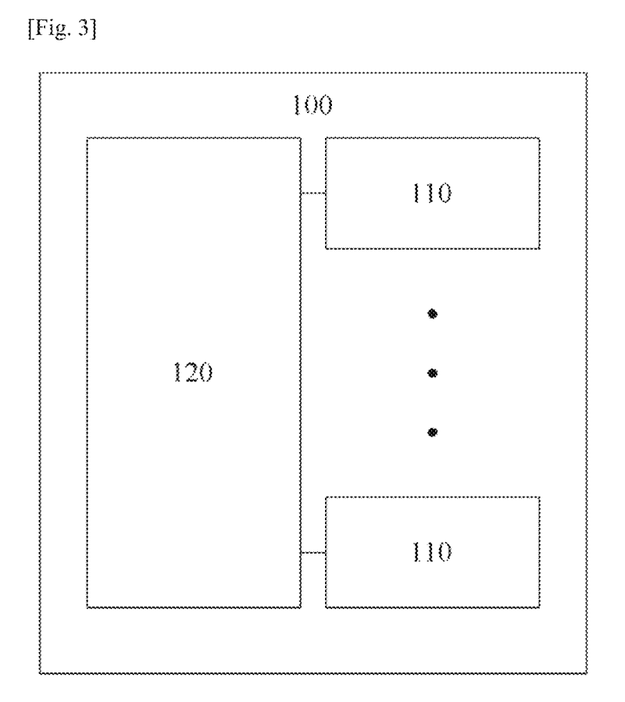
FIG. 3 is a structural diagram of a CPU side HMC controller for a low power mode according to an embodiment of the present disclosure.

FIG. 3 is a structural diagram of a CPU side HMC controller for a low power mode according to an embodiment of the present disclosure.

Referring to FIG. 3, a CPU side HMC controller 100 for a low power mode according to a first embodiment of the present disclosure may include a plurality of link units 110 and a synchronization unit 120.

Each link unit 110 is connected to an HMC side HMC controller through a link. A link unit corresponding to the link unit 110 may be also formed in the HMC side HMC controller. Each link unit 110 may be connected to a corresponding link unit of the HMC side HMC controller through a link. The link may be a high speed serial link.

The synchronization unit 120 may perform synchronization of the link master and the link slave of each link unit 110 to be described later.

Figure 4:
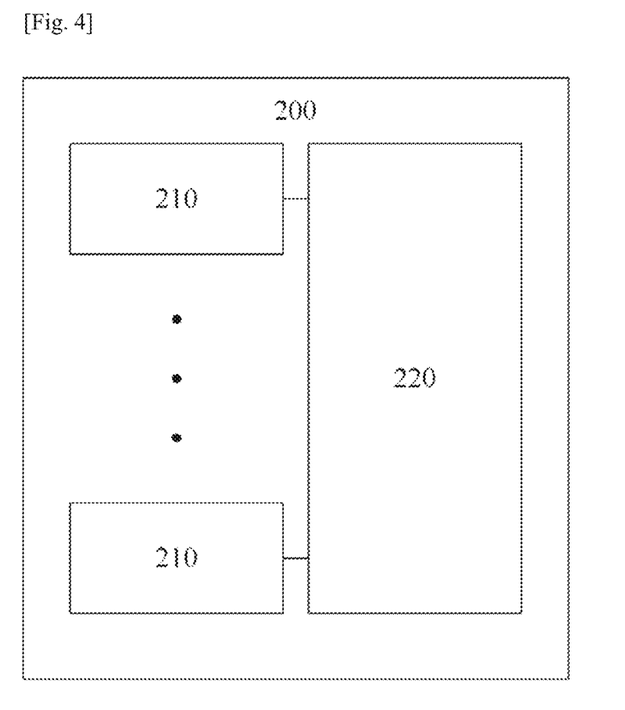
FIG. 4 is a structural diagram of an HMC side HMC controller for a low power mode according to an embodiment of the present disclosure.

FIG. 4 is a structural diagram of an HMC side HMC controller for a low power mode according to an embodiment of the present disclosure.

Referring to FIG. 4, an HMC side HMC controller 200 for a low power mode according to the first embodiment of the present disclosure may include a plurality of link units 210 and a synchronization unit 220.

Each link unit 210 is connected to a CPU side HMC controller via a link. A link unit 110 corresponding to the link unit 210 may be formed in the CPU side HMC controller, and each link unit 210 may be connected to the corresponding link unit 110 of the CPU side HMC controller through a link. The link may be a high speed serial link.

The synchronization unit 220 may perform the synchronization of the link master and the link slave of each link unit 210 which will be described later.

Figure 5:
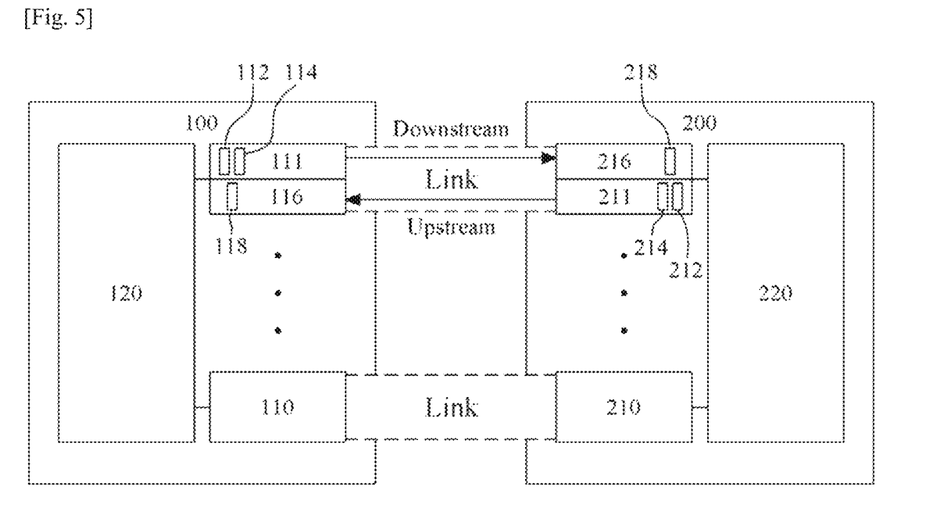
FIG. 5 is a diagram for explaining a method of connecting a CPU side HMC controller and an HMC side HMC controller for a low power mode according to an embodiment of the present disclosure.

FIG. 5 is a diagram for explaining a method of connecting a CPU side HMC controller and an HMC side HMC controller for a low power mode according to an embodiment of the present disclosure.

Referring to FIG. 5, the link unit 110 of the CPU side HMC controller 100 may include a link master 111 and a link slave 116. The link master 111 transmits request packets of the CPU to the HMC side HMC controller, and the link slave 116 receives request packets of the HMC from the HMC side HMC controller.

The link master 111 may include a request buffer 112 and a re-request buffer 114 in which request packets of the CPU is stored. Request packets of the CPU are sequentially stored in the request buffer 112, and the link master 111 transmits the request packets stored in the request buffer 112 through a link in the order that they are stored. The re-request buffer 114 may store request packets transmitted by the link master 111 but not confirmed to be successful. The link master 111 may preferentially transmit request packets stored in the re-request buffer 114 to request packets stored in the request buffer 112.

In addition, the link slave 116 may include a response buffer 118 for storing the received request packets of the HMC. The response buffer 118 sequentially stores the request packets of the HMC transmitted through a link, and transmits them to the CPU in the order that they are stored.

Since the high speed serial link transmits a packet using a clock signal, the link master 111 and the link slave 116 are synchronized through the synchronization unit 120.

Referring to FIG. 5, the link unit 210 of the HMC side HMC controller 200 may also include a link master 211 and a link slave 216. The link master 211 transmits request packets of the HMC to the CPU side HMC controller, and the link slave 216 receives request packets of the CPU from the CPU side HMC controller.

The link master 211 may include a request buffer 212 and a re-request buffer 214 in which request packets of the HMC is stored. Request packets of the HMC are sequentially stored in the request buffer 212, and the link master 211 transmits the request packets stored in the request buffer 212 through a link in the order that they are stored. The re-request buffer 214 may store request packets transmitted by the link master 211 but not confirmed to be successful. The link master 211 may preferentially transmit request packets stored in the re-request buffer 214 to request packets stored in the request buffer 212.

In addition, the link slave 216 may include a response buffer 218 for storing the received request packets of the CPU. The response buffer 218 sequentially stores the request packets of the CPU transmitted through a link, and transmits them to the HMC in the order that they are stored.

The link master 211 and the link slave 216 are synchronized through the synchronization unit 220.

Referring to FIG. 5, each link unit 110 of the CPU side HMC controller 100 is connected to a corresponding link unit 210 of the HMC side HMC controller 200 by a link, respectively. A plurality of links connecting each link unit form a high speed serial link, and the high speed serial link has two paths, i.e., downstream and upstream per link. For example, the link master 111 of the CPU side HMC controller 100 may transmit the request packets of the CPU to the link slave 216 of the HMC side HMC controller 200 through downstream of a link. Meanwhile, the link master 211 of the HMC side HMC controller 200 may transmit the request packets of the HMC to the link slave 116 of the CPU side HMC controller 100 through upstream of the link.

Now, a low power mode switching process of a CPU side HMC controller and an HMC side HMC controller for a low power mode according to an embodiment of the present disclosure will be described in detail.

Figure 6:
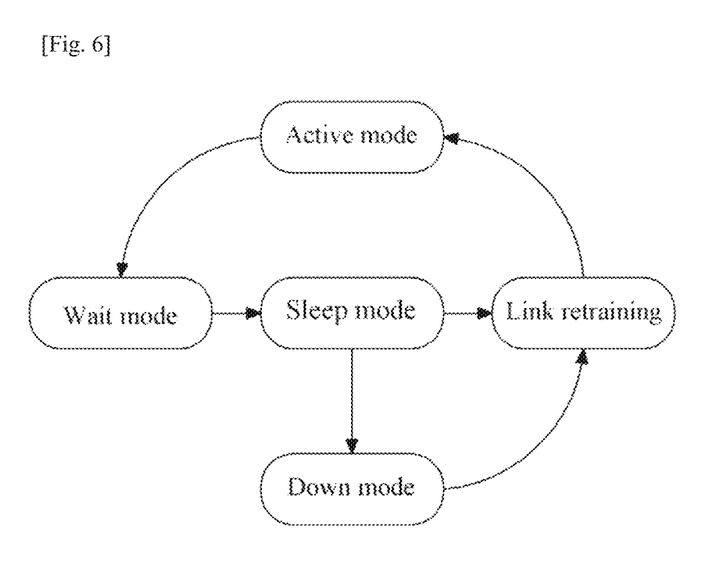
FIG. 6 is a diagram for explaining a low power mode switching of a CPU side HMC controller and an HMC side HMC controller for a low power mode according to an embodiment of the present disclosure.

FIG. 6 is a diagram for explaining a low power mode switching of a CPU side HMC controller and an HMC side HMC controller for a low power mode according to an embodiment of the present disclosure.

In FIG. 6, an active mode is a state where a link is activated, and a sleep mode is a state where a link is deactivated. Each link may remain in the active mode or the sleep mode, depending on a situation. One link goes through a wait mode to switch from the active mode to the sleep mode. A link that has been switched to the wait mode no longer receives any request packets from a CPU, and completes the transmission of all the remaining packets so that there is no packet loss even when it is switched to the sleep mode. The link in the wait mode, which has completed the transmission of all remaining packets, is switched to the sleep mode to minimize power consumption. When the last remaining link in the active mode is switched to the sleep mode, all links switch to a down mode, thereby further minimizing power consumption. The link in the down mode or the sleep mode may switch back to the active mode through link retraining.

Now, the low power mode switching of the CPU side HMC controller and the HMC side HMC controller for the low power mode according to an embodiment of the present disclosure will be described in more detail with reference to FIGS. 3 and 4.

In order for one link to switch to the sleep mode, a request for a low power mode of a CPU is required first. In the related art, when a request for a low power mode of a CPU occurs, a link is immediately switches to a sleep mode when there is no packet request of the CPU for a certain period of time. In this case, there may be a packet in a buffer of the link that has not been transmitted, thereby resulting in packet loss.

In the present disclosure, even when the request for the low power mode of the CPU occurs, the link is not immediately switched to the sleep mode. When the request for the low power mode of the CPU occurs, the link master 111 of the CPU side HMC controller 100 of the present disclosure is switched to a wait mode. Here, the wait mode is a mode newly proposed in the present disclosure, and is a mode for checking the completion of packet transmission before the link is switched to the sleep mode and switching to the sleep mode without packet loss.

The link master 111 in the wait mode maintains the connection of the link and transmits the packets stored in the buffer, but no longer stores new request packets in the request buffer. In other words, the CPU no longer transmits the request packets to a link unit which has been switched to the wait mode, and may transmit the request packets to another link unit which has not been switched to the wait mode.

By using the wait mode, the link unit 110 prepares to enter the sleep mode without losing the packet stored in the buffer. The link master 111 may check whether transmission of other packets in the request buffer 112 is completed. In addition, the link master 111 may check whether all packets stored in the re-request buffer 114 are transmitted. Finally, the link master 111 checks whether all packets in the response buffer 218 of the link slave 216 of the HMC side HMC controller 200 have been transmitted to the HMC. When the link master 111 transmits the packet to the HMC side HMC controller 200, the link master 111 checks whether the response buffer 218 has a space for storing a packet and transmits the packet, in which the link master 111 may check whether the space for storing the packet of the response buffer 218 is an initial value or a maximum value to check whether all packets of the response buffer 218 of the link slave 216 are transmitted to the HMC.

As described above, after the link master 111 checks whether the transmission of the packets stored in the request buffer 112 and the re-request buffer 114 and the response buffer 218 of the link slave 216 of the HMC side HMC controller 200 is completed, it may generate a check packet and transmit the check packet to the HMC side HMC controller 200 only when the request buffer 112, the re-request buffer 114, and the response buffer 218 are all empty. The check packet is a packet for notifying that it is ready to enter the sleep mode from the wait mode. If a packet is stored in any one of the request buffer 112, the re-request buffer 114, and the response buffer 218, the link master 111 waits in the wait mode without generating the check packet.

When the check packet is transmitted to the link slave 216 of the HMC side HMC controller 200, the link master 211 of the HMC side HMC controller 200 is switched to the wait mode.

The link master 211 may check whether transmission of other packets in the request buffer 212 is completed. In addition, the link master 211 may check whether all packets stored in the re-request buffer 214 are transmitted. Finally, the link master 211 checks whether all packets in the response buffer 118 of the link slave 116 of the CPU side HMC controller 100 have been transmitted to the CPU. When the link master 211 transmits the packet to the CPU side HMC controller 100, the link master 211 checks whether the response buffer 118 has a space for storing a packet and transmits the packet, in which the link master 211 may check whether the space for storing the packet of the response buffer 118 is an initial value or a maximum value to check whether all packets of the response buffer 118 of the link slave 116 are transmitted to the CPU.

As described above, after the link master 211 checks whether the transmission of the packets stored in the request buffer 212 and the re-request buffer 214 and the response buffer 118 of the link slave 116 of the CPU side HMC controller 100 is completed, it may generate a check packet and transmit the check packet to the CPU side HMC controller 100 only when the request buffer 212, the re-request buffer 214, and the response buffer 118 are all empty. If a packet is stored in any one of the request buffer 212, the re-request buffer 214, and the response buffer 118, the link master 211 waits in the wait mode without generating the check packet. The check packet is transmitted to the CPU side HMC controller 100, and the link master 211 switches to the sleep mode.

Now, when the check packet is transferred to the CPU side HMC controller 100, the link master 111 is also switched to the sleep mode, and thus a corresponding link is switched to the sleep mode.

Through a process as described above, a corresponding link in the CPU side HMC controller and the HMC side HMC controller for the low power mode according to an embodiment of the present disclosure may be switched to the sleep mode without packet loss, thereby reducing power loss.

Meanwhile, when a link of the last remaining active mode of the CPU side HMC controller and the HMC side HMC controller for the low power mode according to an embodiment of the present disclosure is switched to the sleep mode, it is possible for all links to switch to the down mode to further reduce power loss. In the down mode, the synchronization units 120 and 220 of the CPU side HMC controller and the HMC side HMC controller are switched to deactivation to further reduce power consumption.

Figure 7:
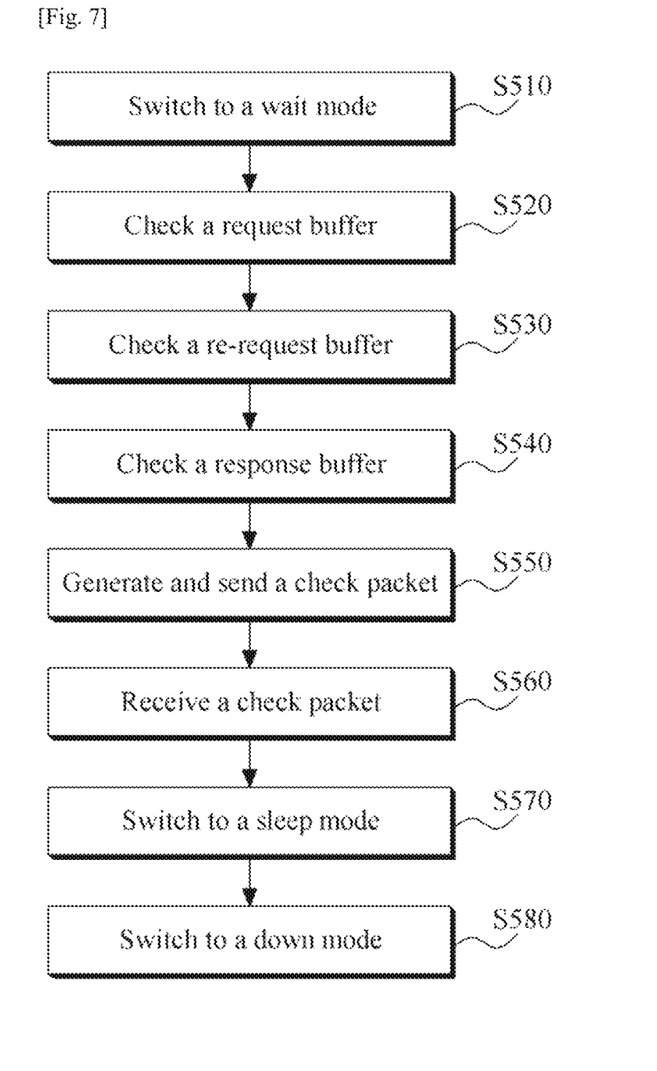
FIG. 7 is a flowchart over time showing a method for controlling a CPU side HMC for a low power mode according to a preferred embodiment of the present disclosure.

FIG. 7 is a flowchart over time showing a method for controlling a CPU side HMC for a low power mode according to a preferred embodiment of the present disclosure.

Referring to FIG. 7, the method for controlling the CPU side HMC for the low power mode according to a preferred embodiment of the present disclosure may include switching to a wait mode (S510), checking a request buffer (S520), checking a re-request buffer (S530), checking a response buffer (S540), generating and transmitting a check packet (S550), receiving the check packet (S560), switching to a sleep mode (S570), and switching to a down mode (S580).

In the step of switching to the wait mode (S510), when a request for a low power mode of the CPU occurs, the link master 111 of the CPU side HMC controller 100 switches to the wait mode. In the wait mode, the link master 111 maintains the connection of the link and transmits packets stored in a buffer, but does not receive a new request packets from the CPU.

In the step of checking the request buffer (S520), the link master 111 checks whether there is a packet in the request buffer 112 that has not been transmitted, and completes transmission of all packets.

In the step of checking the re-request buffer (S530), the link master 111 checks whether all the packets stored in the re-request buffer 114 are transmitted, and completes transmission of the packets if the packets remain in the re-request buffer 114.

In the step of checking the response buffer (S540), the link master 111 checks whether all packets of the response buffer 218 of the link slave 216 of the HMC side HMC controller 200 have been transmitted to the HMC, and waits until the transmission of the remaining packets is complete if the packets remain in the response buffer 218.

In the step of generating and transmitting the check packet (S550), the link master 111 generates and transmits the check packet to the HMC side HMC controller 200 through downstream of a link. The link master 111 transmits the check packet to inform that it may switch to the sleep mode without packet loss.

In the step of receiving the check packet (S560), the link slave 116 of the CPU side HMC controller 100 receives the check packet from the HMC side HMC controller 200. By receiving the check packet, it may know that the link master 211 of the HMC side HMC controller 200 may also switch to the sleep mode without packet loss.

In the step of switching to the sleep mode (S570), the link master 111 switches to the sleep mode. The link master 211 of the HMC side HMC controller 200 also transmits a check packet in step S560 and switches to the sleep mode, so that the corresponding link is switched to the sleep mode.

In the step of switching to the down mode (S580), when all the link units 110 and 210 of the CPU side HMC controller 100 and the HMC side HMC controller 200 are switched to the sleep mode, all the link units are switched to the down mode. In the down mode, the synchronization units 120 and 220 may be deactivated to further reduce power consumption.

Figure 8:
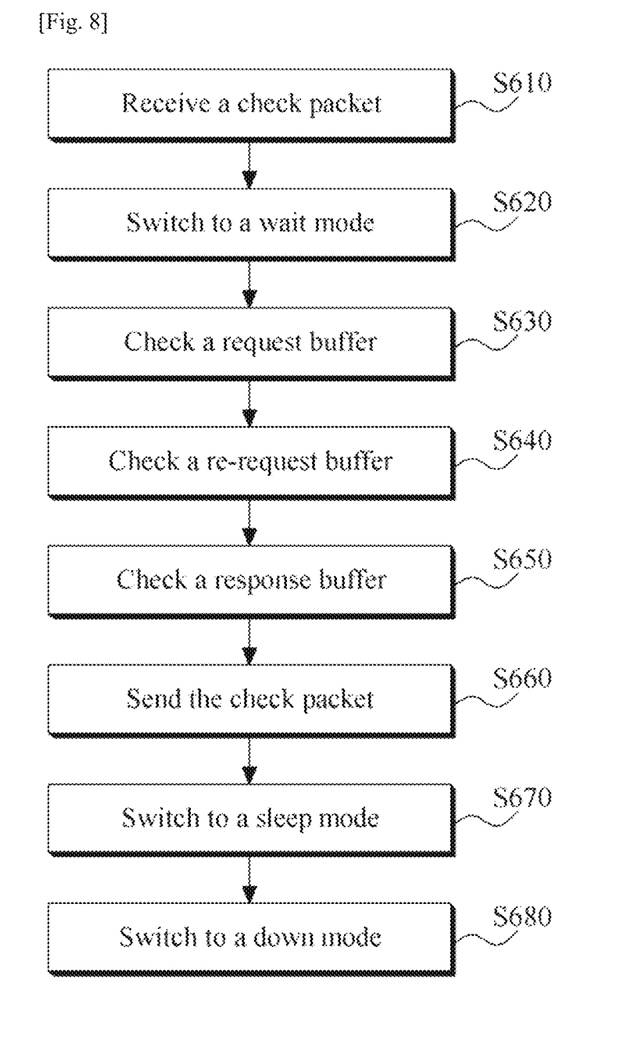
FIG. 8 is a flowchart over time showing a method for controlling an HMC side HMC control for a low power mode according to a preferred embodiment of the present disclosure.

FIG. 8 is a flowchart over time showing a method for controlling an HMC side HMC control for a low power mode according to a preferred embodiment of the present disclosure.

Referring to FIG. 8, the method for controlling the HMC side HMC for the low power mode according to a preferred embodiment of the present disclosure may include receiving a check packet (S610), switching to a wait mode (S620), checking a request buffer (S630), checking a re-request buffer (S640), checking a response buffer (S650), transmitting a check packet (S660), switching to a sleep mode (S670), and switching to a down mode (S680).

In the step of receiving the check packet (S610), the link slave 216 of the HMC side HMC controller 200 receives the check packet from the CPU side HMC controller 100. By receiving the check packet, it may know that the link master 111 of the CPU side HMC controller 100 may also switch to the sleep mode without packet loss.

In the step of switching to the wait mode (S620), the link master 211 of the HMC side HMC controller 200 switches to the wait mode. In the wait mode, the link master 211 maintains the connection of the link and transmits packets stored in a buffer, but does not receive a new request packets from the HMC.

In the step of checking the request buffer (S630), the link master 211 checks whether there is a packet in the request buffer 212 that has not been transmitted, and completes transmission of all packets.

In the step of checking the re-request buffer (S640), the link master 211 checks whether all the packets stored in the re-request buffer 214 are transmitted, and completes transmission of the packets if the packets remain in the re-request buffer 214.

In the step of checking the response buffer (S650), the link master 211 checks whether all packets of the response buffer 118 of the link slave 116 of the CPU side HMC controller 100 have been transmitted to the CPU, and waits until the transmission of the remaining packets is complete if the packets remain in the response buffer 118.

In the step of transmitting the check packet (S660), the link master 211 transmits the check packet to the CPU side HMC controller 100 through upstream of a link.

In the step of switching to the wait mode (S670), the link master 211 of the HMC side HMC controller 200 switches to the wait mode.

In the step of switching to the down mode (S680), when all the link units 110 and 210 of the CPU side HMC controller 100 and the HMC side HMC controller 200 are switched to the sleep mode, all the link units are switched to the down mode. In the down mode, the synchronization units 120 and 220 may be deactivated to further reduce power consumption.

As described above, the present disclosure makes it possible to stably switch a high speed serial link to a low power mode without packet loss by using a process in the wait mode.

Figure 9:
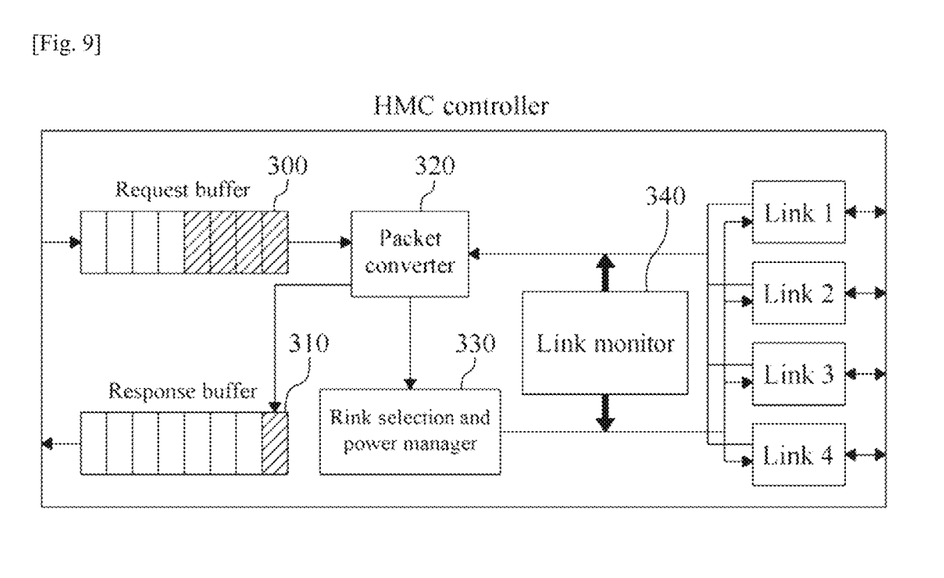
FIG. 9 is a diagram showing the overall structure of an HMC controller according to another embodiment of the present disclosure.

FIG. 9 is a diagram showing the overall structure of an HMC controller according to another embodiment of the present disclosure.

In the system of FIG. 1, the HMC controller is provided on the CPU side and the HMC memory side, and the structure of the HMC controller provided on the CPU and the HMC memory, respectively, is substantially the same. In the present embodiment, the structure of the CPU side HMC controller will be described as an example.

Referring to FIG. 9, an HMC controller according to another embodiment of the present disclosure includes a request buffer 300, a response buffer 310, a packet converter 320, a link selection and power manager 330, and a link monitor 340.

The request buffer 300 sequentially stores the generated request packets. The request packets stored in the request buffer 300 are transferred from the request buffer 300 to the packet converter 320 according to a predetermined time interval or scheduling.

The packet converter 320 converts the request packets into a preset packet form, which means to convert the request packets into a preset form for use on a link. The form of the request packets transmitted through a link will be described with reference to a separate drawing.

The link selection and power manager 330 selects a link to transmit the request packets and performs a power management function according to the present disclosure.

The link selection and power manager 330 selects the link to transmit the request packets among current active links, and the selection of the link may be made in various ways.

In addition, the link selection and power manager 330 servers to determine an appropriate number of active links and control a mode of the link based on the determined appropriate number of active links. For example, if the calculated appropriate number of active links is N and the current number of active links is greater than N, the link selection and power manager 300 switches a mode of a certain active link to the sleep mode. On the other hand, if the calculated appropriate number of active links is N and the current number of active links is less than N, the link selection and power manager 330 switches the certain link in the sleep mode or the down mode to the active mode.

The link monitor 340 serves to accumulate a length of the request packets and the response packets transferred through a link. The link monitor 340 outputs a cumulative length of the request packets and a cumulative length of the response packets transferred through all the links for a certain time, respectively.

The link selection and power manager 330 determines the appropriate number of active links using the cumulative length of the request packets and the cumulative length of the response packets output from the link monitor 340 and perform a power management function.

A link to transfer the converted request packets in the packet converter 320 is selected in the link selection and power manager 340, and the request packets is transferred over the link.

Meanwhile, the response packets is received through a link slave of a link, and the received response packets is converted by the packet converter 320. The response packets converted by the packet converter 320 is sequentially stored in the response buffer 310.

Hereinafter, a method of determining cumulative lengths of request packets and response packets in the link monitor 340 will be described.

According to a preferred embodiment of the present disclosure, the link monitor 340 accumulates the length of the request packets and the response packets by adding a length field to the response packets and the request packets.

Figure 10:
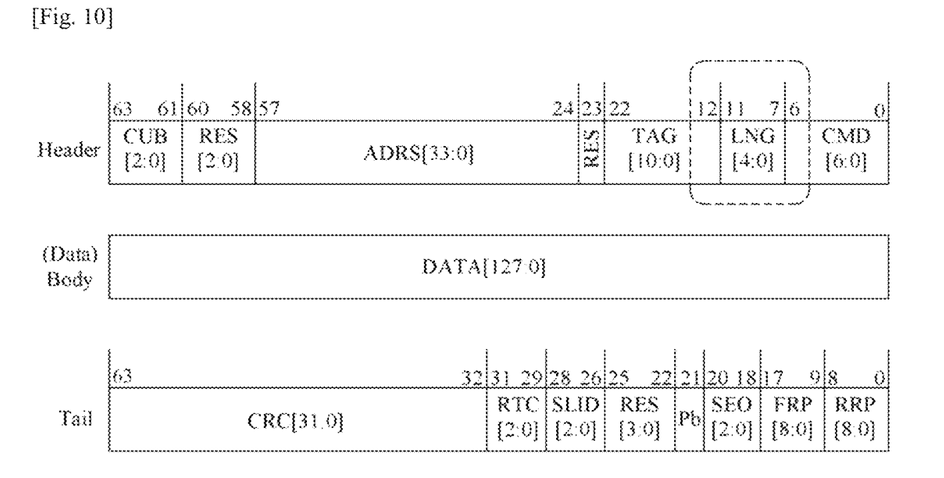
FIG. 10 is a diagram showing of request packets applied to an HMC controller according to another embodiment of the present disclosure.
Figure 11:
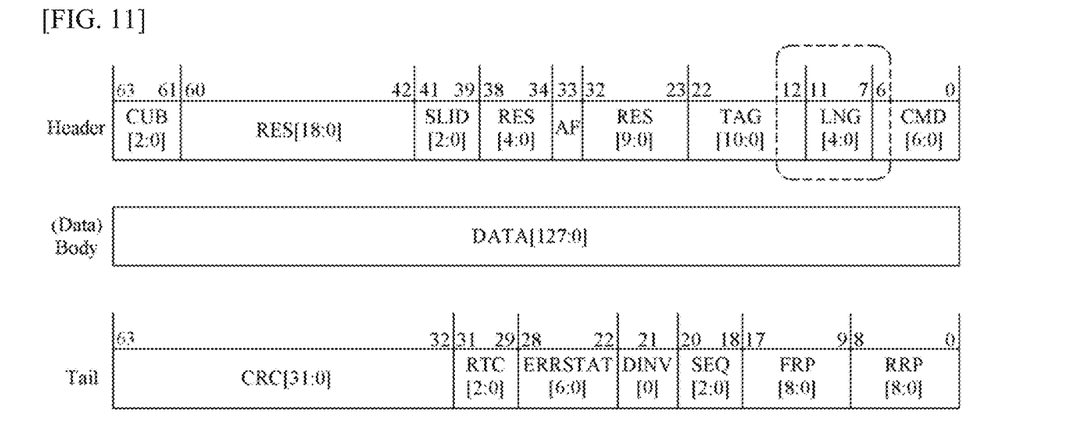
FIG. 11 is a diagram showing of response packets applied to an HMC controller according to another embodiment of the present disclosure.

FIG. 10 is a diagram showing of request packets applied to an HMC controller according to another embodiment of the present disclosure, and FIG. 11 is a diagram showing of response packets applied to an HMC controller according to another embodiment of the present disclosure.

Referring to FIGS. 10 and 11, each of the request packets and the response packets includes a length (LNG) field, and length information of each request packets and response packets is recorded in the length field. According to a preferred embodiment of the present disclosure, packet length information in units of flits may be recorded in the length field. Flit is a unit length of a packet used in the HMC Specification, and defines a packet of 128 bits as one flit. Naturally, it will be apparent to those skilled in the art that the length may be recorded in units other than flits (e.g., bits).

According to a preferred embodiment of the present disclosure, about 7 to 11 bits are allocated to the length (LNG) field so that the length information may be recorded.

The link monitor 340 computes cumulative length information of the request packets and the response packets for a certain time using the length (LNG) fields of the request packets and the response packet. For example, when five request packets are generated during a certain time, the cumulative length information of the request packets may be computed by summing all length values of the length (LNG) fields of the five request packets.

Meanwhile, a certain time for accumulating the length may be preset. For example, the accumulation may be performed for each unit time set by a user called epoch.

The link selection and power manager 330 calculates bandwidths of the response packets and the request packets by using the cumulative length of the request packets during a certain time and the cumulative length of the response packets during a certain time output from the link monitor 340, and calculates an appropriate number of active links based on the calculated bandwidth.

For example, the bandwidth of the request packets may be computed as in Equation 1 below, and the bandwidth of the response packets may be computed as in Equation 2 below.

$$DB = \frac{l_{req} \times Fs}{Et} \times 10^{-6} \quad \langle \text{Equation 1} \rangle$$

$$UB = \frac{l_{res} \times Fs}{Et} \times 10^{-6} \quad \langle \text{Equation 2} \rangle$$

In Equations 1 and 2, DB means a bandwidth of a request packet, UB means a bandwidth of a response packet, $l_{req}$ means a cumulative length of a request packet, $l_{res}$ means a cumulative length of a response packet, Fs means a flit size, and Et means epoch time, which is a unit time at which accumulation occurs.

Naturally, Equations 1 and 2 are merely exemplary examples for calculating a bandwidth. It will be apparent to those skilled in the art that the cumulative length of the request packets and the cumulative length of the response packets may be computed in various ways.

Once the bandwidths of the request packets and the response packets are calculated, the link selection and power manager 330 determines the appropriate number of active links based on the calculated bandwidths. The determination of the appropriate number of active links may be made in various ways in consideration of a CPU speed and a memory capacity of the system in which the HMC memory is used.

Figure 12:
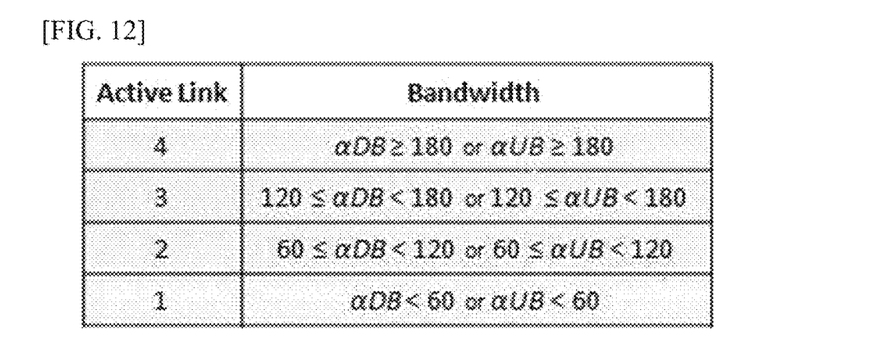
FIG. 12 is a diagram showing an example of a lookup table for determining an appropriate number of active links according to an embodiment of the present disclosure.

According to an embodiment of the present disclosure, the appropriate number of links may be determined using a lookup table that matches the appropriate number of active links with a value obtained by multiplying the computed bandwidths of the request packets and the response packet by a certain scaling constant ($\alpha$).

FIG. 12 is a diagram showing an example of a lookup table for determining an appropriate number of active links according to an embodiment of the present disclosure.

As shown in FIG. 12, the appropriate number of active links may be determined according to the lookup table using a bandwidth value of the request packets and a bandwidth value of the response packet. Naturally, it will be apparent to those skilled in the art that the appropriate number of active links may be determined by other means than the lookup table. For example, an algorithm or an equation may be used to determine the number of active links.

When the appropriate number of active links is determined as described above, the link selection and power manager 330 compares the determined appropriate number of active links with the current number of active links to perform a power management function.

Figure 13:
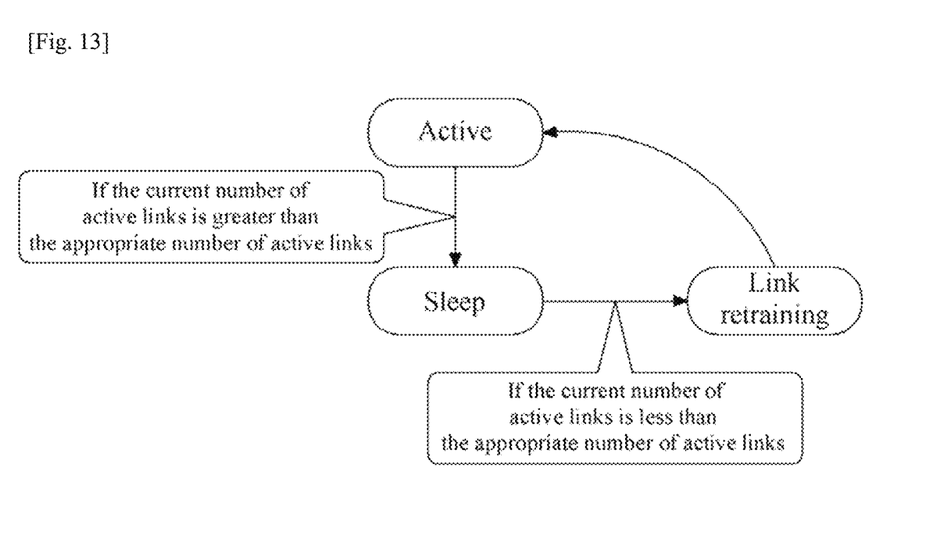
FIG. 13 is a diagram showing an example of a power management function according to an embodiment of the present disclosure.

FIG. 13 is a diagram showing an example of a power management function according to an embodiment of the present disclosure.

Referring to FIG. 13, if the appropriate number of active links is less than the current number of active links, the link selection and power manager 330 performs the power management function to switch a certain number of active links to the sleep mode.

Here, the link selection and power manager 330 may switch the certain number of active links into the sleep mode so that the current number of active links corresponds to the determined appropriate number of active links.

On the other hand, if the appropriate number of active links is less than the current number of active links, the link selection and power manager 330 performs the power management function to switch the certain link in the sleep mode to an active link through link retaining. Even in this case, link mode switching may be performed so that the appropriate number of active links corresponds to the current number of active links.

Figure 14:
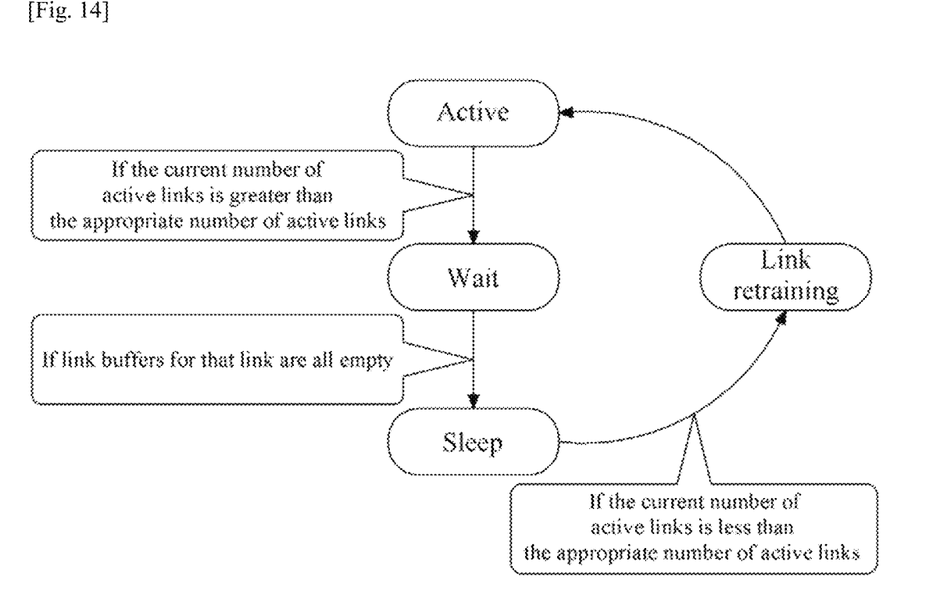
FIG. 14 is a diagram showing an example of switching to a sleep mode according to another embodiment of the present disclosure.

FIG. 14 is a diagram showing an example of switching to a sleep mode according to another embodiment of the present disclosure.

Referring to FIG. 14, if the appropriate number of active links is less than the current number of active links, the link selection and power manager 330 switches the specified number of active links to the wait mode rather than the sleep mode. As in an embodiment of FIG. 13, the link selection and power manager 330 may switch the certain number of active links to the sleep mode so that the current number of active links corresponds to the determined appropriate number of active links.

If link buffers of the HMC side link controller and the CPU side link controller are both empty in the wait mode, the wait mode is switched to the sleep mode. For example, when a certain link is in the wait mode, a link controller determines whether link buffers on the link are all empty. Then, if it is confirmed that all packets in the link buffer have been processed, it switches a state of the link to the sleep mode.

Meanwhile, also in an embodiment of FIG. 14, when the appropriate number of active links is smaller than the current number of active links as in an embodiment of FIG. 13, the link selection and power manager 330 performs the power management function to switch a certain link in the sleep mode to an active link through the link retaining.

Figure 15:
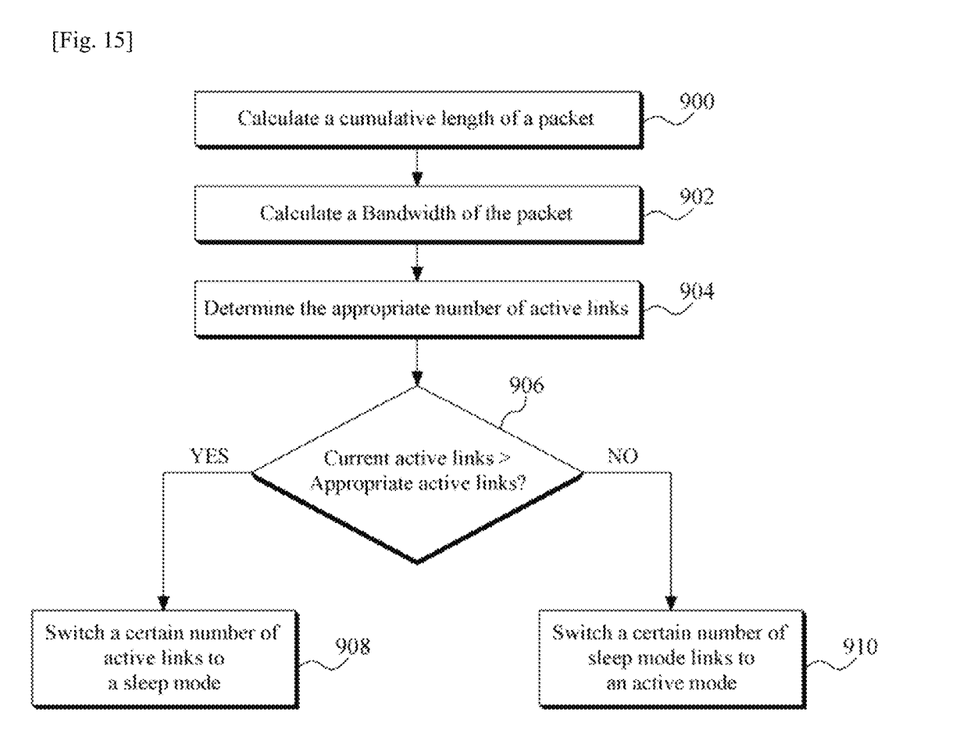
FIG. 15 is a flowchart showing the overall flow of a method for controlling a link considering power efficiency according to an embodiment of the present disclosure.

FIG. 15 is a flowchart showing the overall flow of a method for controlling a link considering power efficiency according to an embodiment of the present disclosure.

Referring to FIG. 15, the link monitor 340 first analyzes the length (LNG) fields of the request packets and the response packets and accumulates the lengths of the request packets and the response packets for a certain time (step 900). For example, the packet length in flits is recorded in the length field, and the cumulative lengths of the request packets and the response packets may be calculated by accumulating the packet length.

The link monitor 340 provides the link selection and power manager 330 with cumulative length information of the request packets and the response packet, and the link selection and power manager calculates the bandwidth of the request packets using the cumulative length of the request packet, and calculates the bandwidth of the response packets using the cumulative length of the response packets (step 902).

Once the bandwidths of the request packets and the response packets are calculated, the link selection and power manager 330 determines the appropriate number of active links using the calculated bandwidths (step 904). As described above, an appropriate number of active links may be determined using a lookup table, an algorithm, an equation, or the like.

When the appropriate number of active links is determined, the current number of active links is compared with the determined appropriate number of active links (step 906).

If the current number of active links is greater than the determined appropriate number of links, then a certain number of active links are switched to the sleep mode (step 908).

If the current number of active links is smaller than the determined appropriate number of active links, a certain number of sleep mode links are switched to the active mode (step 910). The number of links switched to the active mode or the sleep mode in steps 908 and 910 may be based on the determined appropriate number of active links.

Embodiments of the present disclosure may be implemented in the form of program instructions that may be executed by various computer means, and be recorded on a computer readable medium. The computer readable medium may include program instructions, data files, data structures, and the like, alone or in combination. The program instructions recorded on the medium may be those specially designed and constructed for the purposes of the present disclosure, or they may be of the kind well-known and available to those having skill in the computer software arts. Examples of computer-readable recording media include magnetic media such as hard disks, floppy disks, optical media such as CD-ROMs, DVDs, magneto-optical media, such as floptical disks, and ROM, RAM, Flash Memory, or the like. Examples of program instructions recorded on the medium include not only machine code generated by a compiler, but also high-level language code executable by a computer using an interpreter or the like. The hardware device described above may be configured to operate as at least one software module to perform the operations of one embodiment of the present disclosure, and vice versa.

As described above, the present disclosure has been described by specific embodiments such as specific components, and limited embodiments and drawings. However, this is only provided to help a more general understanding of the present disclosure. The present disclosure is not limited to the above embodiment. Those skilled in the art will understand that various modifications and variations are possible from such description. Accordingly, the spirit of the present disclosure should not be limited to the described embodiments. Not only the claims to be described below, but also all equivalents or equivalent modifications to the claims will fall within the scope of the present disclosure.

What is claimed is:

1. A hybrid memory cube (HMC) controller, comprising:
   a link monitor for outputting a cumulative length of request packets and a cumulative length of response packets, processed for a certain time, respectively; and
   a link selection and power manager for calculating a bandwidth of the request packets and a bandwidth of the response packets based on the cumulative length of the request packets and the cumulative length of the response packets output from the link monitor, and determining an appropriate number of active links based on the bandwidth of the request packets and the bandwidth of the response packets,
   wherein the link selection and power manager change a predetermined number of link states by comparing the determined appropriate number of active links with a current number of active links,
   wherein a length (LNG) field is set in the request packets and the response packets, and length information of the request packets or the response packets is recorded in the length field, and
   wherein the link selection and power manager determines the appropriate number of active links based on a lookup table that matches the appropriate number of active links with a value obtained by multiplying the bandwidth of the request packets and the bandwidth of the response packets by a certain scaling constant.

2. The controller of claim 1, wherein the link monitor outputs the cumulative length of the request packets and the cumulative length of the response packets based on the length information of the length field.

3. A method for managing power of hybrid memory cube (HMC) controller, comprising:
   (a) outputting a cumulative length of request packets and a cumulative length of response packets, processed for a certain time, respectively;
   (b) calculating a bandwidth of the request packets and a bandwidth of the response packets based on the cumulative length of the request packets and the cumulative length of the response packets output in step (a), and determining an appropriate number of active links based on the bandwidth of the request packets and the bandwidth of the response packets; and
   (c) changing a predetermined number of link states by comparing the appropriate number of active links determined in step (b) with a current number of active links,
   wherein a length (LNG) field is set in the request packets and the response packets, and length information of the request packets or the response packets is recorded in the length field, and
   wherein in step (b), the appropriate number of active links is determined according to a lookup table that matches the appropriate number of active links with a value obtained by multiplying the bandwidth of the request packets and the bandwidth of the response packets by a certain scaling constant.

4. The method of claim 3, wherein in step (a), the cumulative length of the request packets and the cumulative length of the response packets are output based on the length information of the length field.

5. A recording medium having recorded thereon a program for performing the method of claim 3 and having recorded thereon a computer readable program.

* * * * *